United States Patent [19]

Hochstein

[11] Patent Number: 4,965,835

[45] Date of Patent: Oct. 23, 1990

[54] SIGNAL SENSING CIRCUIT

[76] Inventor: Peter A. Hochstein, 2966 River Valley Dr., Troy, Mich. 48098

[21] Appl. No.: 359,955

[22] Filed: Jun. 1, 1989

[51] Int. Cl.$^5$ .............................................. H03G 3/20
[52] U.S. Cl. .................................... 381/110; 367/198
[58] Field of Search .......................... 381/110; 367/198

[56] References Cited

U.S. PATENT DOCUMENTS

| 4,809,339 | 2/1989 | Shin et al. | 381/110 |
| 4,821,329 | 4/1989 | Straub | 381/110 |

FOREIGN PATENT DOCUMENTS 2031696 4/1980 United Kingdom ................ 381/110

OTHER PUBLICATIONS

"Voice Operated Control Switch" elektor, Dec. 1979, vol. 5, 12-40, 12-41.
Tooley et al., "Sound Operated Switch", Practical Electronics, May, 1979, pp. 46-49.

*Primary Examiner*—Forester W. Isen
*Attorney, Agent, or Firm*—Reising, Ethington, Barnard, Perry & Milton

[57] ABSTRACT

A signal sensing circuit (10) receives an electrical signal on an input (18, 20) to connect power to a controlled device in the presence of an electrical signal and disconnect power in the absense of the electrical signal. The electrical signal is capacitively coupled (28) to an amplifier (30) and low pass filter (32) for amplifying the signal and filtering out high frequency components of the signal thereby eliminating the false triggering by transient noise on the inputs. The signal is rectified (34) and compared (38) to a predetermined set point. When the signal exceeds the set point, a timer (44) is triggered. The timer (44) produces a control signal when triggered for a predetermined time, and can be retriggered by subsequent control signals which resets the predetermined time. The presence of the control signal actuates a switch (48) to supply power to the control device, such as an amplifier.

19 Claims, 1 Drawing Sheet

SIGNAL SENSING CIRCUIT

TECHNICAL FIELD

The subject invention relates to a signal sensing circuit for sensing the presence of a signal, and connecting and disconnecting power to a device in response thereto.

BACKGROUND OF THE INVENTION

Remote speaker systems with integral amplifiers are sometimes equipped with automatic turn-on circuits. These controls automatically energize the power amplifier upon receipt of a low level audio signal and allow the power amplifier to shut down after a given period of time after the cessation of the input signal.

Typical applications include automotive booster amplifiers for stereo systems, remote speakers for stereo systems, or public address installations. In some of these uses, it is simply prudent to reduce the quiescent current drain of the amplifier when no power amplification is required. In other cases, battery operation of the amplified speaker requires that power be conserved by disconnecting the main amplifier from the power source whenever no input signal is present.

One type of automotive automatic turn-on and turn-off system is disclosed in U.S. Pat. No. 4,453,264 issued June 5, 1984 to the inventor of the subject invention. In the automotive environment, the stereo signal comprising left and right input channels are treated identically. The input signal is AC coupled to a differential amplifier stage which generates a ground referenced signal. The signal is AC coupled to a voltage comparator. The comparator in each channel is set to develop a positive going output pulse whenever the input exceeds a predetermined level, generally 30 mV. The output pulses which follow the input signal excursions are or'ed by diodes and feed an integrator capacitor. The voltage across the integrator capacitor is monitored by a MOSFET switch which in turn pulls in a power control relay. Typical transistor characteristics allow the device to turn on whenever the voltage across the integrator capacitor reaches a predetermined level, approximately 4 V. In the absence of any audio input signal, the charge on the capacitor dissipates slowly through a bleeder resistor so as to shut off the FET and drop out the relay after some delay. A problem with this system is that the turn-on sensitivity is linked directly to turn off time delay. Longer delays reduce the turn-on sensitivity because relatively large capacity required in the integrator, and the subsequent delay in reaching the 4 volt turn-on point. An additional problem with type of technology is that human hearing being essentially logarithmic in sensitivity can easily detect very low audio levels in the existing speakers if they are used. The auxiliary, amplified speakers should switch on automatically at this low level, and not at higher levels where their sudden turn-on could be very annoying. Random line noise may invariably trigger on the system. Reducing the turn-on sensitivity by increasing the comparator set point does render the system more noise immune, but increases the turn-on delay.

A second system is disclosed in an article titled "Sound Operated Switch" written by Michael Tooley and David Whitfield in *Practical Electronics*, May 1979 edition. The article discloses a switching circuit which turns on and off in response to an audio frequency signal. The incoming audio frequency signal is applied to an amplifier stage and then to a precision unity gain active full wave rectifier. The output excursion of the rectifier is applied to the comparator whose output is used to enable a conventional timer circuit, which is a 555 timer integrated circuit. It stresses that once the input level has risen sufficiently to trigger the circuit and enable the timer, the output of the monostable will remain high regardless of any subsequent reduction of input level. The problem with this type of design is that the system is not retriggerable. The integrated timer circuit is not retriggerable due to the fact that it receives an input signal and produces an output signal for the predetermined time after which it goes low and waits for another input signal. This would cause blanking out of the speaker.

SUMMARY OF THE INVENTION AND ADVANTAGES

The invention is a signal sensing assembly for sensing audio signal and supplying power in response thereto. The assembly comprises input means for supplying an audio signal. Filter means receives the audio signal and filters out frequency components above a first predetermined frequency to produce a filtered audio signal. Rectifier means receives and rectifies the filtered audio signal to produce a level signal. Comparator means receives the level signal and compares the level signal to a predetermined magnitude to produce a trigger signal. Timer means receives the trigger signal and producing a control signal for a predetermined time in response to said trigger signal and for resetting the predetermined time upon subsequent reception of the trigger signal. Control means receives the control signal to supply power.

The advantages of the subject invention include an automatic turn-on and turn-off system which uses a filter to allow only low frequency signals to trigger the system and the predetermined magnitude of the comparator to be set relatively high so that the system becomes relatively noise immune to input transients. By using a retriggerable timer, the input triggering sensitivity is separated from the timing function. Using this technique, turn off delays of any period may be realized with excellent turn-on sensitivity. Annoying clicks and pops no longer plague the system.

BRIEF DESCRIPTION OF THE DRAWINGS

Other advantages of the present invention will be readily appreciated as the same becomes better understood by reference to the following detailed description when considered in connection with the accompanying drawings wherein.

DESCRIPTION OF THE PREFERRED EMBODIMENT

Figure 1:
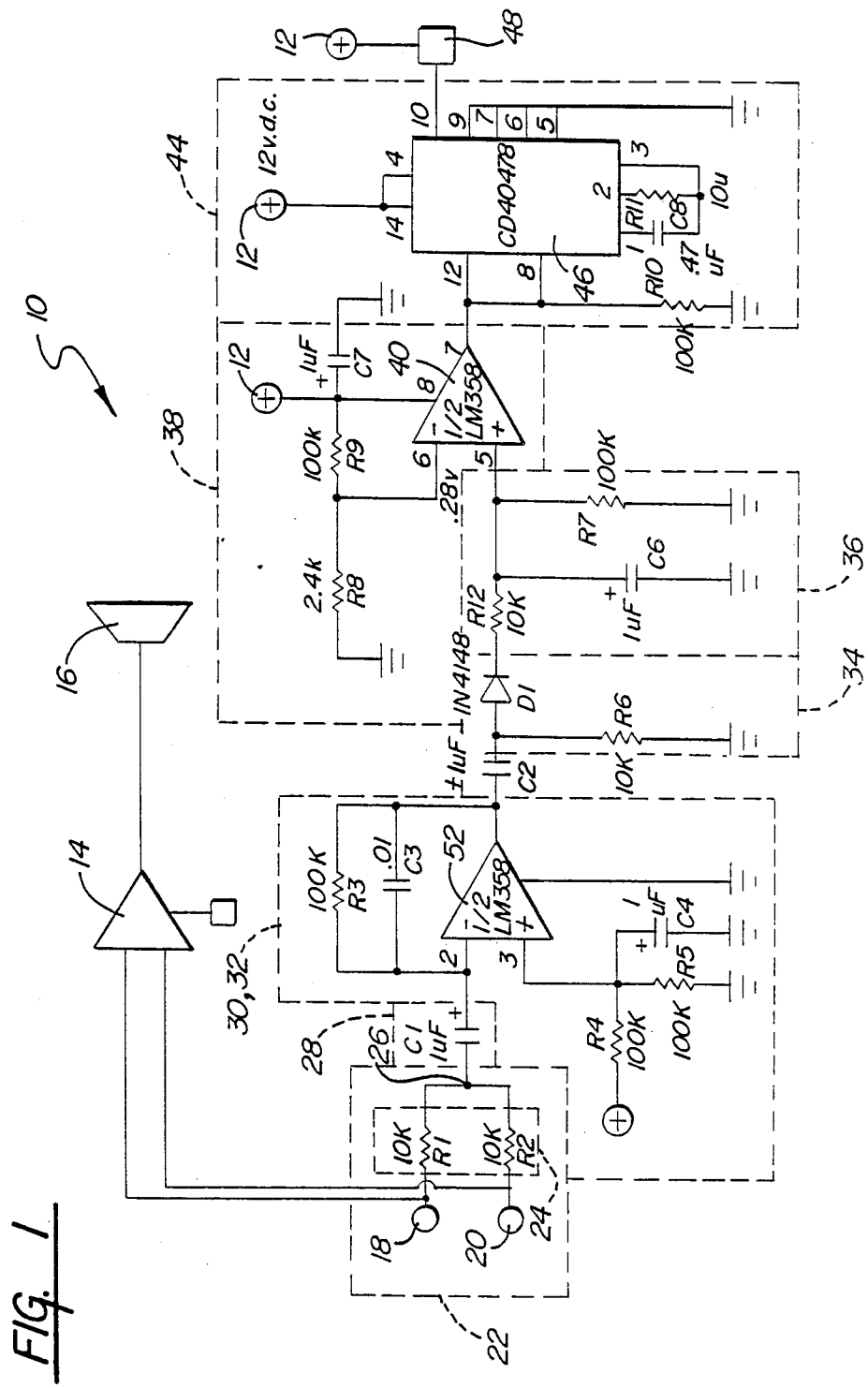
FIG. 1; is a schematic diagram of the subject invention.

A signal sensing assembly for sensing audio signals and supplying power in response thereto is generally shown at 10 in FIG. 1. The assembly 10 includes power supply means 12 for supplying power to the assembly 10. The power supply means 12 is a battery in the preferred embodiment. In order to conserve battery charge, the battery should only be connected to supply power when necessary. Generally, the assembly 10 senses an electrical input signal and supplies power or switches power to a device 14 in response thereto.

In the preferred embodiment, the assembly 10 is utilized in a vehicle having a radio receiver with wires carrying an audio signal running to amplifier 14 and speaker 16 assemblies in a location distant from the radio receiver. As generally understood, the amplifier 14 requires power supplied thereto. Therefore, the assembly 10 interconnects the battery 12 or vehicle battery 12 and the amplifier 14 to supply power to the amplifier 14 when necessary. When the assembly 10 senses an audio signal on input leads 18, 20 from the radio, and power 12 is supplied to the amplifier 14 for a predetermined time, unless retriggered. In the absence of an audio signal, no power will be supplied to the amplifier 14 therefore conserving battery 12 charge.

The assembly 10 includes input means 22 for receiving an electrical signal. In the preferred embodiment, the electrical signal is an audio signal received from the bridge drive of a vehicle radio. The input stage is single ended. It has been experimentally determined that sampling the differential output from the bridge drive is best done with respect to ground, even through only half the voltage excursion is available. The input means 22 includes a first single ended input 18 from the right or first channel of the radio, and a second single ended input 20 from the left or second channel of the radio. There may be one or any number of channels, and the invention is not limited to two channels. The input means 22 includes summing means 24 for receiving the first and second inputs 18, 20 and summing or adding the inputs 18, 20 to produce a combined audio signal. The summing means 24 may comprise a summing resistor R1, R2 on each channel and combined at a common point 26 to produce the audio signal.

The assembly 10 includes coupling means 28 for receiving the audio signal from the common point and capacitively coupling the same to eliminate dc components in the audio signal to prevent saturation of the input amplifier means 30, as subsequently discussed. The coupling means is a capacitor C1.

The assembly 10 further includes input amplifier means 30 and input filter means 32. The filter means 32 receives the audio signal and filters out frequencies above a first predetermined frequency, approximately 400 Hz, to produce a filtered audio signal. The amplifier means 30 amplifies the filtered audio signal. The amplifier means 30 and the filter means 32 are comprised of an operational amplifier 52 having the filter characteristics in its feedback. The use of the ac coupling 28 in conjunction with the high frequency attenuation afforded by the filter 32 and amplifier 30, yields a bandpass characteristic. Restricting the frequency band to essentially a 50 Hz to 400 Hz range, effectively keeps noise from triggering the timer 44, as subsequently described.

The output from the input amplifier means 30 is capacitively coupled by a capacitor C2 to rectifier means 34. The rectifier means 34 receives and rectifies the amplified audio signal to produce a level signal. The rectifier means 34 is generally a half wave rectifier, comprising a diode D1. The rectifier means 34 is connected to a low pass filter 36. The low pass filter 36 receives the output from the rectifier means 34 and allows frequency signals below a second predetermined frequency to produce the level signal. With the values herein indicated, maximum voltage gain is realized at about 200 Hz. For a 50 mV peak to peak input at 200 Hz, a recovered d.c. voltage of about 0.5 V is generated as the level signal. Input levels of this order are barely audible in an 8 ohm speaker and charge the filter capacitor in under 0.5 seconds.

The assembly 10 includes comparator means 38 which receives the level signal and compares the level signal to a predetermined magnitude to produce a trigger signal. The comparator means 38 is generally an operational amplifier 40 configured as a comparator wherein the non-inverting input receives the trigger signal and the inverting input is connected to the predetermined magnitude or set point 42. The predetermined magnitude is set at a relatively high level, approximately 0.3 volts allowing the assembly 10 to become reasonably noise immune to input transients associated with noise. The comparator 38 acts as a digital level shifter developing a positive output whenever the level signal exceeds nominally 0.3 volts.

The assembly 10 includes timer means 44 for receiving the trigger signal to produce a control signal for a predetermined time and for resetting the predetermined time delay upon each subsequent reception of the trigger signal. At the expiration of the predetermined time a second signal is produced indicative of turning off the switch 48. The control signal is initiated and produced within a specified time from the reception of the trigger signal, wherein the predetermined time is independent of the specified time. The specified time may comprise the turn-on time of the device 14, which is substantially instantaneous. Whereas the predetermined time may be varied by using different valued components, and which is not dependent on the turn-on time as in the prior art. A positive trigger signal initiates the predetermined time delay. The timer means 44 includes retriggerable monostable 46, such as standard CMOS digital component CD4047B, for producing the control signal for the predetermined time and for resetting the predetermined time in response to a subsequent reception of the trigger signal. The control signal may be chosen to be either high or low.

The control means 48 receives the control signal to supply power to a device 14. The control means 48 is generally a solid state switch or relay responsive to the monostable timer 44 and which connects power. The switch 48 is generally a relay which is energized by the retriggerable monostable 44 and connected to power 12. The switch 48 closes to connect power to the amplifier 14 when the control signal is produced and opens to disconnect power to the amplifier 14 in the absence of the control signal.

In the preferred embodiment, the switch 48 will connect power to the amplifier 14. The amplifier 14 also receives the inputs 18, 20 for amplifying same when power is supplied to the amplifier 14.

The more specific circuitry includes a resistor R1, R2 (both 10K.) connected to each input 18, 20 and to the common point 26. The capacitor C1 (1uF) is connected to the common point 26 and the inverting input of operational amplifier 52, the input amplifier 30 and filter 32. A resistor R3 (100K.) and capacitor C3 (0.01F.) are connected in parallel between the inverting input and output of the op-amp 52. The non-inverting input is connected to a resistor R4 (100K.) to power and to a resistor R5 (100K.) to ground and to a capacitor C4 (1uF) to ground. The output of op-amp 52 is connected to capacitor C2 (1uF) to the rectifier 34. The capacitor D2 is connected to diode D1 and to resistor R6 (10K.) to ground. The output of the diode D1 is connected to resistor R12 (10K.). Resistor R12 is connected to capacitor C6 to ground and to resistor R7 (100K.) to ground, comprising the low pass filter 36. The resistor R12 is connected to the non-inverting input of operational amplifier 40 of the comparator 38. The set point is connected at the inverting input and comprises a resistor R8 (2.4K.) connected to ground and the inverting input, resistor R9 (100K.) connected to power and the inverting input, and a capacitor C7 (1uF) connected to power and ground. The output of the comparator 38 is connected to pin 12 of the monostable 46. Pins 4 and 14 are connected to power, pins 8 and 12 are connected to resistor R10 (100K.) to ground, pins 5, 6, 7, and 9 are grounded, pin 1 is connected through capacitor C8 (0.47uF) to pin 3 and to pin 2 through resistor R11 (10M.), and pin 10 produces the control signal.

Also included is a method of sensing audio signals and supplying power to a device in response thereto. The method includes the steps of receiving an audio signal, filtering out frequency components above a first predetermined frequency in the audio signal to produce a filtered audio signal, rectifying the filtered audio signal to produce a level signal, comparing the level signal to a predetermined magnitude to produce a trigger signal, producing a control signal for a predetermined time in response to the trigger signal and for resetting the predetermined time upon subsequent reception of the trigger signal, receiving the control signal to supply power to a device. Also included are the steps of receiving the output from the rectifying step and allowing frequency signals below a second predetermined frequency to produce the level signal, receiving a first single ended input from a first channel and second single ended input from a second channel to produce the audio signal, and summing said inputs to produce a combined audio signal for the filtering.

It is to be understood that the subject invention may be used in any environment where a switch is controlled by the presence or absence of an electrical signal.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

What is claimed is:

1. A signal sensing assembly for sensing audio signals and supplying power to a device in response thereto, said assembly comprising; input means (22) for supplying an audio signal, coupling means (C1) for eliminating dc components from the audio signal; input filter and amplifier means (32) for receiving said audio signal from said coupling means (C1) and amplifying said audio signal while attenuating frequency components above a first predetermined frequency producing a filtered signal, rectifier means (34) for receiving and rectifying said filtered signal to produce a level signal, comparator means (38) for receiving said level signal and comparing said level signal to a predetermined magnitude to produce a trigger signal, timer means (44) for receiving said trigger signal and producing a control signal for a predetermined time in response to said trigger signal, said timer means comprising a (44) retriggerable monostable (46) for producing said control signal for said predetermined time and for restarting said predetermined time in response to a subsequent reception of said trigger signal, and control means (48) for receiving said control signal to supply power to the device (14).

2. An assembly as set forth in claim 1 further characterized by including amplifier means (30) for amplifying said audio signal to produce said level signal.

3. A signal sensing assembly for sensing audio signals and supplying power to a device in response thereto, said assembly comprising: input means (22) for supplying an audio signal; first coupling means (C1) for eliminating dc components from the audio signal; input filter and amplifier means (30, 32) for receiving said audio signal from said first coupling means (C1) and for amplifying said audio signal while attenuating frequency components above a first predetermined frequency producing a filtered signal; rectifier means (34) for receiving and rectifying said audio signal and producing a rectified signal; low pass means (36) for receiving said rectified signal and producing a level signal upon receiving said rectified signal for a minimum duration; comparator means (38) for receiving said level signal and comparing said level signal to a predetermined magnitude to produce a trigger signal; timer means (44) for receiving said trigger signal and producing a control signal within a specified time from receiving said trigger signal and producing said control signal for a predetermined time in response to said trigger signal, said predetermined time being independent of said specified time and for resetting said predetermined time upon subsequent reception of said trigger signal; and control means (48) for receiving said control signal to supply power to the device (14).

4. An assembly as set forth in claim 3 further characterized by said timer means (44) including a retriggerable monostable (46) for producing said control signal for said predetermined time and for resetting said predetermined time in response to a subsequent reception of said trigger signal.

5. A signal sensing assembly for sensing audio signals and supplying power to a device in response thereto, said assembly comprising; input means (22) comprising first and second inputs for supplying an audio signal, summing means (24) for receiving said first (18) and second (20) inputs and summing said inputs (18, 20) to produce a combined audio signal (32); first coupling means (C1) for eliminating dc components from the combined audio signal; input filter and amplifier means (30, 32) for receiving said combined audio signal and filtering out frequency components above a first predetermined frequency to produce a filtered audio signal, second coupling means (C2) for eliminating dc components from the filtered audio signal; rectifier means (34) for receiving and half wave rectifying said amplified signal to produce a rectified signal, low pass means (36) for receiving said rectified signal from said rectifier means (34) and for producing a level signal upon receiving said rectified signal for a minimum duration; comparator means (38) for receiving said level signal and comprising said level signal to a predetermined magnitude to produce a trigger signal, timer means (44) for receiving said trigger signal and producing in response to said trigger signal and for an initial period a control signal having a predetermined duration and for restarting said predetermined duration upon subsequent reception of said trigger signal during said initial period, said timer means (44) including a retriggerable monostable (46) for producing said control signal for said predetermined duration and for restarting said predetermined duration in response to a subsequent reception of said trigger signal; and control means (48) for receiving said control signal to cause a power supply means to supply power for powering the device (14).

6. An assembly as set forth in claim 5 further characterized by said input comprising a first single ended input (18) from a first channel and a second single ended input (20) from a second channel.

7. An assembly as set forth in claim 6 further characterized by including audio transducer means (16) for receiving an audio signal and producing audible signals.

8. An assembly as set forth in claim 6 further including in combination said device, said device comprising first channel amplifier means (14) for receiving and amplifying said audio signal on said first single ended input (18) in response to power supplied from said control means.

9. An assembly as set forth in claim 8 further characterized by said control means (48) including switch means for receiving said control signal and connecting said power supply means to the device during said predetermined time and disconnecting said power supply means in the absence of said control signal.

10. An assembly as set forth in claim 9 further characterized by said summing means (24) comprising resistive means on each of said inputs and connected at a common point producing said audio signal.

11. An assembly as set forth in claim 10 further characterized by said first coupling means comprising a capacitor for coupling ac components.

12. An assembly as set forth in claim 11 further characterized by said input filter and amplifier means (32) comprising an operational amplifier having feedback comprising a resistor and a capacitor in parallel to slew rate limit said amplifier.

13. An assembly as set forth in claim 12 further characterized by said second coupling means (C2) comprising a capacitor.

14. An assembly as set forth in claim 13 further characterized by said rectifier means (34) comprising a diode.

15. An assembly as set forth in claim 14 further characterized by said low pass means (36) comprising a resistor (R12) and capacitor (C6).

16. An assembly as set forth in claim 15 further characterized by said comparator means (38) comprising an operational amplifier having a first input connected to said low pass filter means (36) and a second input connected a resistive divider for establishing the predetermined magnitude.

17. An assembly as set forth in claim 6 further characterized by said power supply means comprising a battery.

18. A method of sensing audio signals and supplying power to a device in response thereto, the method including the steps of; receiving an audio signal on two channels, summing the audio signals producing a single audio signal, capacitively coupling the single audio signal to eliminate dc components in the audio signal, amplifying and filtering out frequency components above a first predetermined frequency in the audio signal to produce a filtered audio signal, capacitively coupling the filtered audio signal to eliminate dc components, rectifying the filtered audio signal to produce a rectified signal, receiving the rectified signal and producing a level signal upon reception of said rectified signal for a minimum duration, comparing the level signal to a predetermined magnitude to produce a trigger signal, producing in response to the trigger signal and for an initial period a control signal having a predetermined duration and restarting the predetermined duration upon subsequent reception of the trigger signal during said initial period of said predetermined duration, supplying power to the device in response to the control signal.

19. A method as set forth in claim 18 further including producing a control signal within a specified time of receiving the level signal, the specified time being independent of the predetermined time.

* * * * *